United States Patent
Miyoshi et al.

(10) Patent No.: US 8,373,246 B2
(45) Date of Patent: Feb. 12, 2013

(54) SEMICONDUCTOR DEVICE COMPRISING STACK OF PN JUNCTION DIODE AND SCHOTTKY BARRIER DIODE

(75) Inventors: Seiji Miyoshi, Ora-Gun (JP); Tetsuya Okada, Kumagaya (JP); Shiho Arimoto, Ora-gun (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 203 days.

(21) Appl. No.: 12/816,499

(22) Filed: Jun. 16, 2010

(65) Prior Publication Data
US 2010/0320557 A1    Dec. 23, 2010

(30) Foreign Application Priority Data
Jun. 19, 2009   (JP) ................. 2009-146037

(51) Int. Cl.
*H01L 29/66*   (2006.01)

(52) U.S. Cl. ....................................... 257/476; 257/471
(58) Field of Classification Search ................. 257/471, 257/476
See application file for complete search history.

(56) References Cited

U.S. PATENT DOCUMENTS

| | | | | |
|---|---|---|---|---|
| 5,021,840 A | * | 6/1991 | Morris .......................... | 257/476 |
| 6,852,580 B2 | * | 2/2005 | Yanagihara et al. .......... | 438/170 |
| 7,193,291 B2 | * | 3/2007 | Lee et al. ...................... | 257/472 |

FOREIGN PATENT DOCUMENTS
JP    10-335679    12/1998

* cited by examiner

*Primary Examiner* — Chuong A Luu
*Assistant Examiner* — Robert Bachner
*(74) Attorney, Agent, or Firm* — Morrison & Foerster LLP

(57) ABSTRACT

Provided is a semiconductor device having an anode of a Si-FRD and a cathode of a Si-SBD which are serially connected. The Si-SBD has a junction capacitance whose amount of accumulable charge is equal to or more than an amount of charge occurring at the time of reverse recovery of the Si-FRD, and has a lower breakdown voltage than the Si-FRD does.

3 Claims, 4 Drawing Sheets

$$C_{SBD} \times \frac{dV}{dt} \times trr\_s \geqq Q_{rr, FRD} \qquad \cdot\cdot(\text{Formula})$$

FIG.4A
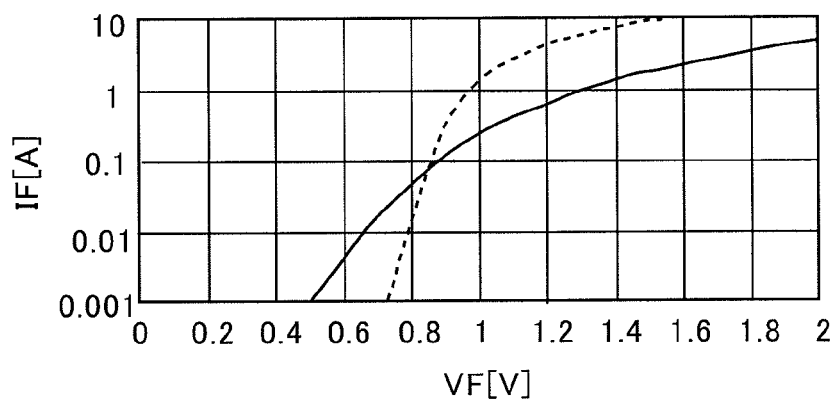
Forward I-V characteristics
FIG.4B
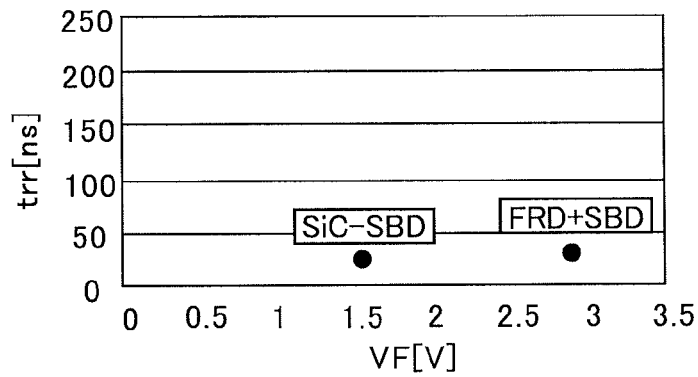
FIG.4C
| | VF | trr | Qrr |
|---|---|---|---|
| | IF=10A | IF=10A, dI/dt=100A μs, VR=400V | |
| | V | ns | nC |
| SiC-SBD | 1.54 | 24 | 19.6 |
| FRD+SBD | 2.9 | 31 | 21.6 |

Prior Art

SEMICONDUCTOR DEVICE COMPRISING STACK OF PN JUNCTION DIODE AND SCHOTTKY BARRIER DIODE

This application claims priority from Japanese Patent Application Number JP 2009-146037, filed on Jun. 19, 2009, the content of which is incorporated herein by reference in its entirety.

BACKGROUND OF THE INVENTION

1. Field of the Invention

The present invention relates to a semiconductor device, and particularly relates to a semiconductor device which achieves reduction of both a reverse recovery time and a forward voltage.

2. Description of the Related Art

A fast recovery diode (FRD, hereinafter referred to as a Si-FRD) using a silicon semiconductor substrate is known as a pn junction diode with improved switching time. This technology is described for instance in Japanese Patent Application Publication No. Hei 10-335679 (page 20, FIG. 39).

Meanwhile, a Schottky barrier diode (SBD, hereinafter referred to as a Si-SBD) using a silicon semiconductor substrate is known to have a short reverse recovery time which is a characteristic of the device itself.

Moreover, an SBD using a silicon carbide substrate (hereinafter referred to as a SiC-SBD) is in the process of marketing as a next-generation device.

FIG. 6 is a diagram showing characteristics of a forward voltage VF and a reverse recovery time trr in a case of IF=10 A in a Si-FRD and a SiC-SBD.

The reverse recovery time trr needs to be reduced in the Si-FRD. The reverse recovery time is a time required until an amount of charge Qrr accumulated in the device is emitted at the time of turn-off when a forward bias is turned into a reverse bias. However, reducing the reverse recovery time trr causes a problem of increasing the forward voltage VF (see a dotted line (trade-off line) in FIG. 6).

To be more precise, the characteristics of the forward voltage VF and the reverse recovery time trr (hereinafter referred to as VF-trr characteristics) have a trade-off relationship as shown in FIG. 6. In the current situation, either the forward voltage VF characteristic or the reverse recovery time trr characteristic is sacrificed according to the usage. Meanwhile, the Si-SBD has a short reverse recovery time trr, but requires a very high forward voltage VF when being produced as a device having a breakdown voltage of, for example, 600 V. Accordingly, the Si-SBD has the same problem with the Si-FRD.

In contrast, the SiC-SBD has a low forward voltage VF and a short reverse recovery time trr, and thus the VF-trr characteristics can be improved. However, the SiC-SBD as a completed wafer costs 20 times or more than the Si-FRD, and thus is very expensive.

SUMMARY OF THE INVENTION

The invention provides a semiconductor device that includes a pn junction diode having an anode and a cathode, and a Schottky barrier diode having an anode and a cathode. The anode of the pn junction diode and the cathode of the Schottky barrier diode are electrically connected so that the pn junction diode and the Schottky barrier diode are serially connected.

BRIEF DESCRIPTION OF THE DRAWINGS

FIGS. 4A to 4C are characteristic diagrams for comparing the semiconductor device according to the preferred embodiment of the invention with a conventional technique.

DESCRIPTION OF THE INVENTION

A preferred embodiment of the invention will be described in detail by using FIGS. 1 to 5.

Figures 1, 2:
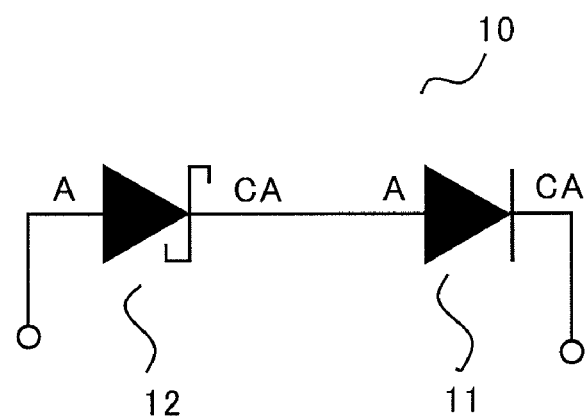
FIG. 1 is a circuit diagram for explaining a semiconductor device according to a preferred embodiment of the invention.
FIG. 2 is a conditional expression to be satisfied by the semiconductor device according to the preferred embodiment of the invention.

FIG. 1 is a circuit diagram for explaining a semiconductor device 10 according to a preferred embodiment of the invention. The semiconductor device 10 includes a pn junction diode 11 and a Schottky barrier diode 12.

The pn junction diode 11 is a pn junction diode, for example, in which a p type impurity region is provided in a surface of an n type silicon semiconductor layer. More specifically, the pn junction diode 11 is an FRD having a short reverse recovery time and has a breakdown voltage of, for example, 400 V. The Schottky barrier diode 12 is an SBD, for example, in which a metal layer (Ti, for example) is provided on a surface of an n type silicon semiconductor layer of the same conductivity type as the FRD 11 and a Schottky barrier junction is provided for these. The SBD 12 has a lower breakdown voltage than the FRD 11 does, which is approximately 40 V, for example. In the semiconductor device 10, an anode A of the FRD 11 is serially connected to a cathode CA of the SBD 12.

FIG. 2 shows a formula representing a relationship in amount of charge in a reverse recovery time between the FRD 11 and the SBD 12. The semiconductor device 10 of this embodiment satisfies this condition. A predetermined junction capacitance $C_{SBD}$ parasites the SBD 12 when a reverse voltage is applied to the SBD 12, and an amount of charge accumulable in the junction capacitance $C_{SBD}$ is equal to or more than an amount of charge occurring in the FRD 11 at the time of reverse recovery.

In the formula, dV/dt denotes a relative voltage change of the SBD 12 in the reverse recovery time trr from the start of spreading of a depletion layer at the reverse voltage application until the end of the spreading; trr_s denotes a reverse recovery time trr of the SBD 12; and $Qrr,_{FRD}$ denotes an amount of charge occurring in the FRD 11 at the time of reverse recovery.

Figure 3:
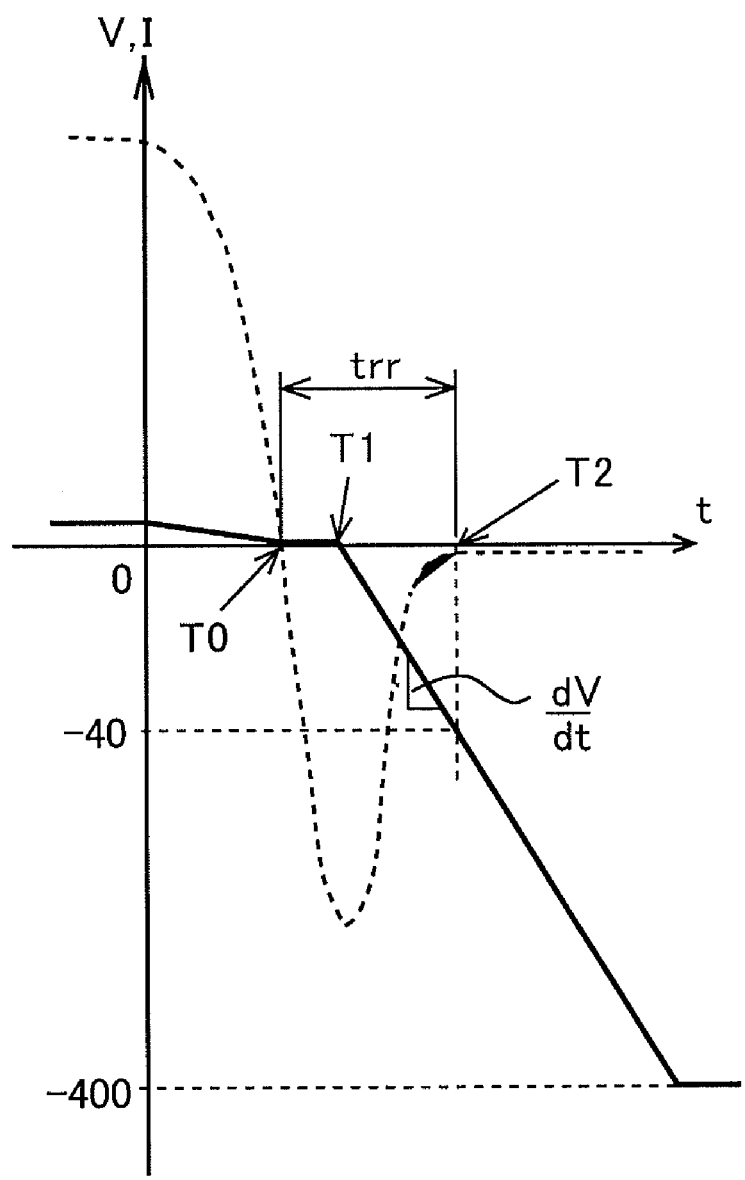
FIG. 3 is a characteristic diagram for explaining the semiconductor device according to the preferred embodiment of the invention.

FIG. 3 is a schematic diagram for explaining the semiconductor device 10 of this embodiment. FIG. 3 is a diagram showing how a current I (a broken line) and a voltage V (a solid line) of the semiconductor device 10 change when the semiconductor device 10 switches from on to off.

At the time of t=0 in FIG. 3, the semiconductor device 10 switches from on (a forward voltage applied thereto) to off (a reverse voltage applied thereto). Since holes do not move but only electrons move in a Schottky barrier junction region in the SBD 12, the depletion layer starts to spread in a fraction of the time. However, when a guard ring is formed around the Schottky barrier junction region by diffusing a p type impurity, the depletion layer starts to spread after minority carriers (holes) injected into a substrate at the forward voltage application are extracted.

More specifically, in FIG. 3, the reverse recovery time trr_s of the SBD 12 is a period from t=T0 to t=T2, but timing when the depletion layer starts to spread in the semiconductor substrate after the reverse voltage is applied to the SBD 12 starts at t=T1. Although described in detail later, the reverse recovery time trr_s of the SBD 12 is equal to the reverse recovery time trr of the semiconductor device 10 in this embodiment. Thus, in FIG. 3, the reverse recovery time trr_s of the SBD 12 is shown as the reverse recovery time trr.

In this case, the relative voltage change in a period from the time t=T1 to the time of depletion spread completion t=T2 in the reverse recovery time trr_s is dV/dt.

A depletion layer changes over time in a reverse recovery time. To be more specific, the junction capacitance $C_{SBD}$ of the SBD 12 shown in the formula in FIG. 2 is a junction capacitance of the SBD 12 formed of the depletion layer changing over time, from the start to the end of the spreading of the depletion layer, in response to the voltage applied in the reverse recovery time of the SBD 12. The junction capacitance $C_{SBD}$ is a function of the voltage.

Referring again back to FIG. 2, the left-hand side of the conditional expression in this embodiment shows the product of the aforementioned junction capacitance $C_{SBD}$, the relative voltage change dV/dt and the reverse recovery time trr_s, and thus means an amount of charge which can be absorbed by the SBD 12 alone. The amount of charge is set to be larger than an amount of charge Qrr, $_{FRD}$ (right-hand side) occurring at the time of reverse recovery of the FRD 11 alone. Furthermore, the cathode CA of the SBD 12 having a low breakdown voltage (for example, 40 V) is serially connected to the anode of the FRD 11 having a high breakdown voltage (for example, 400 V). Thereby, the charge Qrr, $_{FRD}$ occurring in the FRD 11 can be absorbed in the SBD 12 immediately. The absorption in the SBD 12 causes the reverse recovery time trr in the semiconductor device 10 to consist of only the reverse recovery time trr_s in the SBD 12. Accordingly, the reverse recovery time trr can be reduced.

When the voltage applied to the semiconductor device 10 is switched from the forward voltage to the reverse voltage, the reverse voltage is firstly applied to the both ends of the SBD 12. This causes a charge Qrr, $_{SBD}$ accumulated in the SBD 12 to be emitted. Then, the depletion layer starts to spread, after minority carriers (holes) emitted into the semiconductor substrate, if any, are extracted. At a measurement point on the anode side of the SBD 12, the reverse recovery time trr_s of the SBD 12 is measured as the reverse recovery time trr of the semiconductor device 10. The depletion layer continues to spread in the SBD 12 until the reverse voltage reaches the breakdown voltage (for example, 40 V, see FIG. 3).

When the reverse voltage exceeds the breakdown voltage of the SBD 12, the SBD 12 breaks down with the depletion layer held, the depletion layer having spread to the maximum. The reverse voltage exceeding the breakdown voltage of the SBD 12 is applied to the FRD 11 only.

When subjected to application of the reverse voltage, the FRD 11 starts to emit the charge Qrr, $_{FRD}$. However, the charge Qrr, $_{FRD}$ is absorbed into the junction capacitance of the depletion layer spreading in the SBD 12. In this embodiment, the charge Qrr, $_{FRD}$ occurring in the FRD 11 in this manner can entirely be absorbed into the junction capacitance of the SBD 12. Thus, the charge Qrr, $_{FRD}$ is not measured on the anode side of the SBD 12 as the reverse current in the semiconductor device 10.

As described above, the reverse recovery time trr as the semiconductor device 10 consists of the reverse recovery time trr_s of the SBD 12, and thus can be made shorter than a conventional reverse recovery time. In addition, as the breakdown voltage of the semiconductor device 10, the breakdown voltages of the FRD 11 and SBD 12 (for example, 400 V+40 V, see FIG. 3) can be ensured.

FIGS. 4A to 4C show results of comparison in characteristic between the semiconductor device 10 (SBD+FRD) of this embodiment and a SiC-SBD. A broken line represents the SiC-SBD, while a solid line represents the semiconductor device 10 of this embodiment. FIG. 4A shows forward I-V characteristics. The vertical axis represents a forward current IF, while the horizontal axis represents a forward voltage VF.

FIG. 4B shows a relationship between the forward voltage VF and the reverse recovery time trr. The vertical axis represents the reverse recovery time trr, while the horizontal axis represents the forward voltage VF. There are provided measurement conditions for the reverse recovery time: a forward current IF=10 A; dI/dt (a current change ratio relative to time)=100 A/μs; and a reverse voltage VR=400 V.

FIG. 4C shows comparisons among the forward voltage VF, the reverse recovery time trr and the amount of charge Qrr, based on the forward current IF=10 A. There are provided measurement conditions for the reverse recovery time: the forward current IF=10 A; dI/dt=100 A/μs, and the reverse voltage VR=400 V.

Based on these conditions, in the case of the forward voltage VF=1.54 V and the forward current IF=10 A, the SiC-SBD has a reverse recovery time trr of 24 ns. In contrast, the semiconductor device 10 (SBD+FRD) has an amount of charge Qrr which are equal to the SiC-SBD, although having a relatively high forward voltage VF of 2.9 V. In addition, a reverse recovery time trr thereof is reduced to 31 ns.

Meanwhile, at a point of VF=1.5 V in FIG. 4A, the semiconductor device 10 (SBD+FRD) has IF=2 A, which is one fifth of IF=10 A in the SiC-SBD.

Due to the serial connection of the FRD 11 and SBD 12, the semiconductor device 10 of this embodiment has a forward voltage $V_{F,FRD}$ of the FRD 11 and a forward voltage $V_{F,SBD}$ which are summed up, as a forward voltage characteristic. Thus, the semiconductor device 10 has a large forward voltage VF as the entire semiconductor device 10, if no remedy is taken. However, this can be improved by increasing the operating areas of the FRD 11 and the SBD 12. For example, reviewed from the above results, it is believed that increasing the current area by five times makes the forward voltage VF equal to that of the SiC-SBD.

Even though the operating area (chip size) of the semiconductor device 10 is increased by five times, a finished wafer is less expensive than the SiC-SBD.

Figure 5:
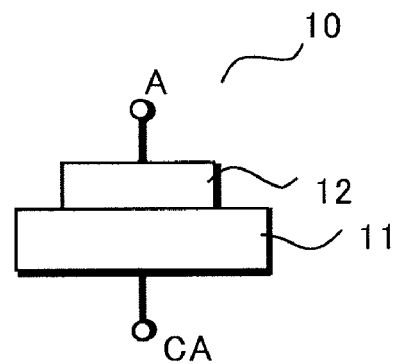
FIG. 5 is a schematic diagram for explaining the semiconductor device according to the preferred embodiment of the invention.
Figure 6:
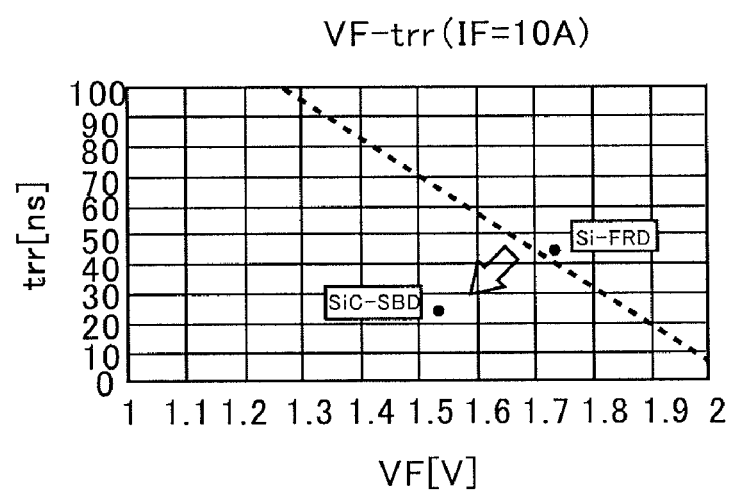
FIG. 6 is a characteristic diagram for explaining the relation between a forward voltage and a reverse recovery time in a Si-FED and a SiC-SBD.

FIG. 5 is a schematic diagram showing a structure of the semiconductor device 10 of this embodiment. For example, the SBD 12 is fixedly attached to a semiconductor chip of the FRD 11 having an anode A as a front surface and a cathode CA as a back surface. The SBD 12 has a cathode CA as a back surface and an anode A as a front surface. Thus, the cathode CA of the SBD 12 and the anode A of the FRD 11 are electrically connected.

As described above, the description has been given in this embodiment by taking an example of a case where the FRD 11 and the SBD 12 are formed on the silicon semiconductor substrate. However, the preferred embodiment can be implemented in the same manner in a silicon carbide (SiC) semiconductor substrate, and the same effect can be obtained.

According to this embodiment, the VF-trr characteristics can be improved in a device using a silicon semiconductor substrate. Specifically, a high-speed reverse recovery time trr can be achieved, by serially connecting an FRD and an SBD having a junction capacitance capable of accumulating a charge equal to or more than a charge occurring in the FRD at the time of reverse recovery, and by absorbing the charge occurring in the FRD in the SBD at the time of reverse recovery.

The serial connection of the FRD and the SBD results in a forward voltage VF of the entire semiconductor device which is a sum of the forward voltage $V_{F.FRD}$ of the FRD and a forward voltage $V_{F.SBD}$ of the SBD. However, increasing the chip size can make the forward voltage VF equal to that of a SiC-SBD. Even though the chip size is increased, a semiconductor device can be achieved at lower cost than in a SiC-SBD having the equal forward voltage characteristic.

What is claimed is:

1. A semiconductor device comprising:
   a pn junction diode comprising an anode and a cathode; and
   a Schottky barrier diode comprising an anode and a cathode, the anode of the pn junction diode and the cathode of the Schottky barrier diode being electrically connected so that the pn junction diode and the Schottky barrier diode are serially connected,
   wherein an amount of charge accumulable in a junction capacitance of the Schottky barrier diode is greater than or equal to an amount of charge occurring when a reverse voltage exceeding a breakdown voltage of the Schottky barrier diode is applied to the pn junction diode, and
   the Schottky barrier diode has a lower breakdown voltage than the pn junction diode,
   wherein the cathode of the pn junction diode is configured to operate as a cathode terminal of the semiconductor device, and the anode of the Schottky barrier diode is configured to operate as an anode terminal of the semiconductor device.

2. The semiconductor device of claim 1, wherein the pn junction diode and the Schottky barrier diode are formed in a silicon semiconductor substrate.

3. A semiconductor device comprising:
   a first semiconductor substrate comprising a pn junction diode and comprising a top surface configured to operate as an anode and a bottom surface configured to operate as a cathode; and
   a second semiconductor substrate comprising a Schottky barrier diode and comprising a top surface configured to operate as an anode and a bottom surface configured to operate as a cathode, the bottom surface of the second semiconductor substrate being attached to the top surface of the first semiconductor substrate so that the anode of the pn junction diode and the cathode of the Schottky barrier diode is electrically connected and that the pn junction diode and the Schottky barrier diode are serially connected, and the first semiconductor substrate being different from the second semiconductor substrate.

* * * * *